(12) United States Patent
Maki et al.

(10) Patent No.: US 9,810,743 B2
(45) Date of Patent: Nov. 7, 2017

(54) DETERIORATION DIAGNOSIS SYSTEM

(71) Applicant: Hitachi, Ltd., Chiyoda-ku, Tokyo (JP)

(72) Inventors: Kohji Maki, Tokyo (JP); Shinya Yuda, Tokyo (JP); Hiroaki Kojima, Tokyo (JP); Satoshi Kikuchi, Tokyo (JP); Hisashi Endo, Tokyo (JP)

(73) Assignee: Hitachi, Ltd., Tokyo (JP)

(\*) Notice: Subject to any disclaimer, the term of this patent is extended or adjusted under 35 U.S.C. 154(b) by 256 days.

(21) Appl. No.: 14/707,245

(22) Filed: May 8, 2015

(65) Prior Publication Data
US 2015/0331051 A1 Nov. 19, 2015

(30) Foreign Application Priority Data
May 13, 2014 (JP) .................. 2014-099214

(51) Int. Cl.
| | | |
|---|---|---|
| *G01R 31/14* | (2006.01) | |
| *G01R 31/00* | (2006.01) | |
| *G01R 31/34* | (2006.01) | |
| *G01M 13/04* | (2006.01) | |
| *G01R 31/12* | (2006.01) | |
| *G01R 31/02* | (2006.01) | |

(52) U.S. Cl.
CPC .......... *G01R 31/343* (2013.01); *G01M 13/04* (2013.01); *G01R 31/34* (2013.01); *G01R 31/025* (2013.01); *G01R 31/12* (2013.01)

(58) Field of Classification Search
CPC .... G01R 31/343; G01R 31/34; G01R 31/025; G01R 31/12; H01M 13/04
USPC .................. 324/510, 750.02, 765.01
See application file for complete search history.

(56) References Cited

U.S. PATENT DOCUMENTS

| | | | | |
|---|---|---|---|---|
| 2010/0177452 | A1* | 7/2010 | Wei .................. | H02P 29/02 361/111 |
| 2013/0278282 | A1* | 10/2013 | Leppich ............ | G01R 31/343 324/765.01 |
| 2014/0084937 | A1* | 3/2014 | Neti .................. | G01R 31/343 324/510 |

FOREIGN PATENT DOCUMENTS

| | | |
|---|---|---|
| JP | 6-138168 A | 5/1994 |
| JP | 2007-288829 A | 11/2007 |
| JP | 2013-130440 A | 7/2013 |

\* cited by examiner

*Primary Examiner* — Farhana Hoque
(74) *Attorney, Agent, or Firm* — Crowell & Moring LLP

(57) ABSTRACT

Provided is a deterioration diagnosis system which diagnoses deterioration of an N-phase rotational machine (N denotes a natural number). The deterioration diagnosis system includes a first current sensor to be attached individually to at least lead wires of (N-1)-phases in a rotational machine, the first current sensor being able to detect a current amplitude arising from a plurality of deterioration causes, and a second current sensor to be attached collectively to the lead wires of all phases in the rotational machine, the second current sensor being able to detect a current amplitude arising from a plurality of deterioration causes.

17 Claims, 4 Drawing Sheets

DETERIORATION DIAGNOSIS SYSTEM

BACKGROUND OF THE INVENTION

1. Field of the Invention

The present invention relates to a deterioration diagnosis system to diagnose bearing deterioration, insulation deterioration and the like in a rotational machine such as a motor and a generator.

2. Description of the Related Art

A rotational machine such as a motor and a generator may stop due to a sudden failure, which may cause heavy losses. Especially in the case of a shutdown resulting from a sudden failure of a high-voltage motor used in plant equipment or in a similar facility could cause a significant adverse impact such as a reduction in production capacity utilization and a revision of production plans. Survey results show that about 40% and 25% of high-voltage motor failures are caused by deterioration of a bearing and of stator winding insulation, respectively. In addition, variable-speed drive/an inverter is becoming commonly applied in a high-voltage motor for the purpose of energy saving, which leads to a problem of accelerations in insulation deterioration due to an inverter surge and in bearing deterioration due to electric erosion. This trend is anticipated to be more conspicuous because of the appearance of semiconductor devices using a new material such as silicon carbide (SiC). Therefore, there is an increasing demand to achieve a highly accurate diagnosis of bearing deterioration and insulation deterioration during operation, to prevent a sudden failure of a motor and a generator.

To meet such demand, JP-06-138168-A, for example, discloses a technique for measuring automatically, in an operating state, a maximum discharge magnitude of a partial discharge which occurs during operation, by means of a current sensor attached to a feeder. In addition, JP-2013-130440-A discloses a technique for calculating an insulation resistance of each phase, by means of a harmonic of a measured zero-phase current. Further, JP-2007-288829-A discloses a technique for detecting an abnormality of a machine connected to a motor by comparing actually-measured frequency and current with preset abnormal values of frequency and current, respectively.

SUMMARY OF THE INVENTION

In the above conventional arts, however, separate and different causes are diagnosed. If a diagnosis system is designed to detect all diagnosis matters mentioned in the conventional arts, it is necessary to install a group of sensors for each of the diagnosis matters, which increases the number of sensors. This will result in a cost increase, for example.

In view of the above circumstances, an object of the present invention is to provide a deterioration diagnosis system capable of performing a deterioration diagnosis with a simple configuration.

To achieve the above object, a deterioration diagnosis system according to the present invention is configured to diagnose deterioration of an N-phase rotational machine (N denotes a natural number), and the deterioration diagnosis system includes: a first current sensor to be attached individually to at least lead wires of (N-1)-phases in the rotational machine, so as to detect a current amplitude arising from a plurality of deterioration causes; and a second current sensor to be attached collectively to the lead wires of all phases in the rotational machine, so as to detect a current amplitude arising from a plurality of deterioration causes.

As described above, the present invention makes it possible to provide a deterioration diagnosis system capable of performing a deterioration diagnosis with a simple configuration.

DESCRIPTION OF THE PREFERRED EMBODIMENTS

Embodiments of the present invention are described below, with reference to the attached drawings. The inventors, as described in the following embodiments, focused on the fact that a signal frequency band varies depending on a part they wish to observe. In other words, a sign of bearing deterioration appears in a low frequency region of a stator winding current, while a sign of insulation deterioration appears in a high frequency region of the stator winding current. In the embodiments, therefore, a wide band current sensor is used. The result of detection by the current sensor is shared to make diagnoses attributable to a plurality of deterioration causes, so that a sign of bearing deterioration and a sign of insulation deterioration of a stator winding can be monitored simultaneously in a single current measurement. To detect a sign of insulation deterioration, a leakage current flowing through an insulating material, and a partial discharge pulse generated in the insulating material are measured.

In the embodiments, a wide band current sensor is used, and the result of detection by the current sensor is shared to make diagnoses attributable to a plurality of deterioration causes. This enables a single sensor to have a plurality of diagnosis functions.

As a result, a highly accurate diagnosis of deterioration is achieved in a bearing, insulation, and the like during operation, with a simple configuration, specifically with a reduced number of sensors.

In the following description, a motor will be used as an example of a rotational machine. In the case of a generator, the power flow direction is opposite to that of the motor. (Specifically, the power flow changes in an opposite way, depending on whether power is provided from a power supply, or generated power is provided to the outside.) However, configurations of the embodiments are the same as the case of the motor. Also, while a three-phase rotational machine is described as an example, the embodiments are able to be generalized to N-phase rotational machines (N denotes a natural number) as well as the three-phase rotational machine.

It is obvious that the following description is given solely for the purpose of providing examples of the embodiments, allowing various alterations and modifications thereof, and the scope of aspects of the present invention is not limited by such examples.

First Embodiment

Figure 1:
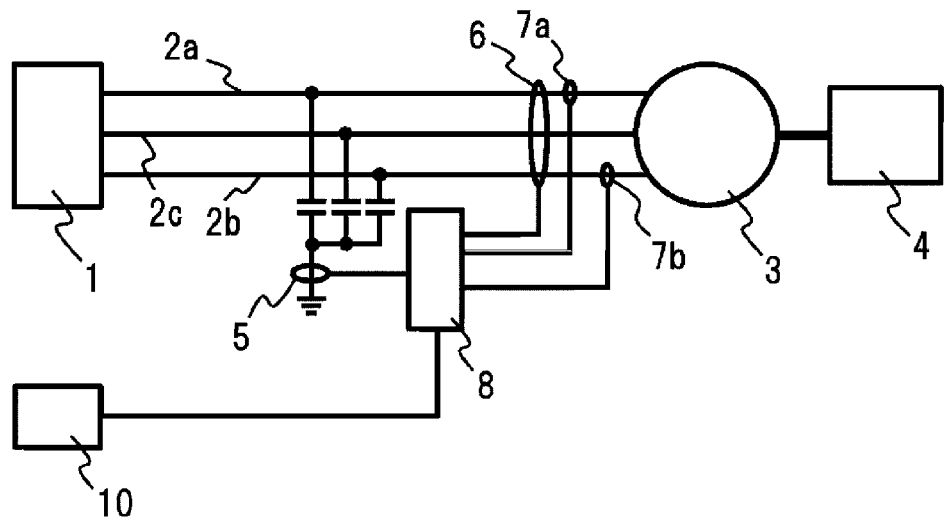
FIG. 1 is a configuration diagram of a deterioration diagnosis system according to a first embodiment of the present invention.

FIG. 1 is a configuration diagram showing a first embodiment of a bearing-deterioration and insulation-deterioration diagnosis system of the present invention. Power is supplied from a power supply 1 to a motor 3 via a feeder 2a, 2b, 2c. A load machine 4 is connected to the motor 3. Although a three-phase motor using three (3) feeders is described here, the embodiment is applicable to a motor with a different number of phases. A first current sensor is attached to individual lead wires of at least (N-1)-phases in a rotational machine. As the three-phase motor is used in the embodiment, the first current sensor 7a, 7b is attached to each of the lead wires of two phases. A second current sensor 6 is attached collectively to the lead wires of all phases in the rotational machine. Further, a third current sensor 5 is attached collectively to ground wires connected individually to each of the lead wires of all the phases.

Figure 2:
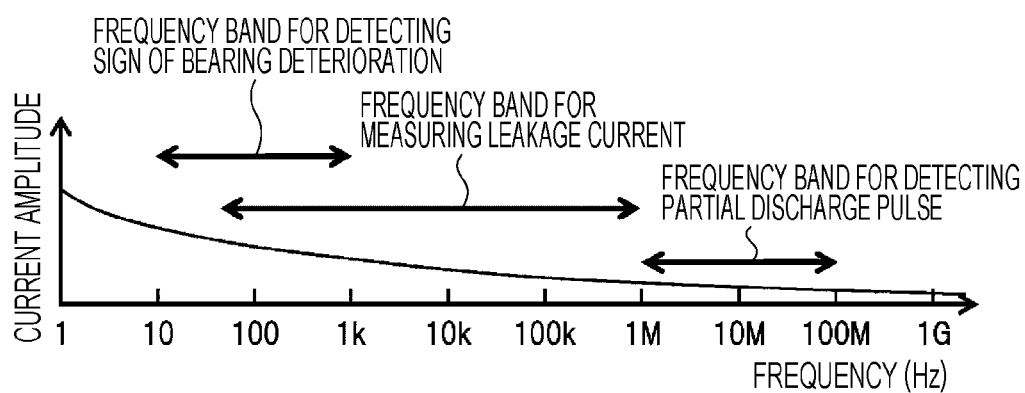
FIG. 2 is a conceptual diagram illustrating a frequency spectrum of a stator winding current in a rotational machine.

FIG. 2 is a conceptual diagram illustrating a frequency spectrum of a stator winding current. The frequency spectrum is obtained from a current measurement. As shown in the frequency spectrum in the diagram, a sign of bearing deterioration appears mainly in a region of frequency ranging from 10 Hz to 1 kHz. The region of frequency is determined based on the number of motor rotations and the bearing configuration. A leakage current which flows through an insulating material of the stator winding appears mainly in a region of frequency ranging from 50 Hz to 1 MHz. The frequency corresponds to that of an inverter output voltage including a fundamental wave component and a high frequency component. Further, a signal of a partial discharge pulse generated in the insulating material appears mainly in a region of frequency ranging from 1 MHz to 100 MHz, or in a region of high frequency of more than 100 MHz, as the partial discharge pulse lasts for only a short time. Bearing deterioration diagnosis is based on the current value of a single phase to which the first current sensor 7a, 7b is not attached. Such current value is derived from calculating the difference between a value measured by the second current sensor 6 and the sum of values measured by the first current sensors 7a, 7b. Meanwhile, the second current sensor 6 measures the partial discharge pulse passing through the lead wire after being generated in the insulating material inside of the motor. In addition, the second current sensor 6 is used to measure the leakage current which flows through the insulating material of the stator winding. The third current sensor 5 is used to measure the partial discharge pulse passing through the ground wire to earth, after being generated in the insulating material inside of the motor. Furthermore, the first current sensor 7a, 7b is used for the bearing deterioration diagnosis which is made based on a measurement of the partial discharge pulse generated in the insulating material inside of the motor, and a measurement of a phase current. Therefore, a sensor having a sensitivity in a frequency band covering a range at least from 10 Hz to 10 MHz, and more preferably in a frequency band ranging (covering a range) from 0 Hz (this means the sensor has a sensitivity to a direct current) to 100 MHz, is used as the first current sensor 7a, 7b and the second current sensor 6.

A current analyzer 8 analyzes measurement data acquired by (at least any of) the current sensors, and converts the data into a piece of information relating to a sign of bearing deterioration and a piece of information relating to a sign of insulation deterioration. An information transmission device 10 conveys such piece of information to a user. The information transmission device 10 can be a visual warning device such as a display and a lamp, or an acoustic warning device such as a buzzer. The deterioration diagnosis system is also able to combine the piece of information relating to a sign of bearing deterioration and the piece of information relating to a sign of insulation deterioration, to make a predictive diagnosis based on a combination of the pieces of information.

The current analyzer 8 desirably has an information processing circuit (e.g., a microcomputer circuit) which performs frequency separation of a detection signal from each current sensor (including other additional current sensors to be described in the embodiments described below) and performs different processing with respect to each frequency band.

The following is an example of a method for detecting a sign of bearing deterioration: The sum of squares of each phase current is calculated, based on current values measured by the first current sensor 7a, 7b and the second current sensor 6. Then, the sum of the squares is Fourier-expanded to obtain a spectrum in a frequency band ranging from 10 Hz to 1 kHz. The sign of bearing deterioration is detected as a difference between the above spectrum and a spectrum obtained in a normal state. While the above example is given here, another detection method is applicable, provided that a difference from a normal state, which appears in a frequency band ranging from 10 Hz to 1 kHz, is extracted by such method.

The following is an example of a method for detecting a sign of insulation deterioration: For example, a value of a zero-phase current measured by the second current sensor 6, and the sum of each-phase voltage applied to the motor by the power supply, are Fourier-expanded individually to be compared with each other with respect to the same frequency component. Thereby the capacitance and the insulation resistance (including the contribution of dielectric loss), or a dielectric tangent (tan δ) of an insulating member are derived, so that a sign of insulation deterioration can be obtained. While the above example is given here, another detection method is applicable, provided that a difference from a normal state, which appears in a region of frequency of a zero-phase current ranging mainly from 50 Hz to 1 MHz, is extracted by such method.

Lastly, in order to detect a partial discharge pulse, a comparison of polarity is made between a current pulse measured by the third current sensor 5 and a current pulse measured by the first current sensor 7a, 7b and the second current sensor 6. Only a current pulse which is determined, from the result of the comparison, to be a single pulse propagated from the motor side is identified as a partial discharge pulse generated in the insulating material inside of the motor. The third current sensor 5 is desirably capable of detecting a current amplitude in a frequency band from 1 MHz and over.

The deterioration diagnosis system according to the embodiment includes a first current sensor to be attached individually to at least lead wires of (N-1)-phases, and a second current sensor to be attached collectively to lead wires of all phases in a rotational machine. A sensor which is capable of detecting a current amplitude arising from a plurality of deterioration causes (by covering a wide band) is used for both of the first and second current sensors. As a result, a deterioration diagnosis such as a diagnosis of bearing deterioration or insulation deterioration is achieved, with a simple configuration.

Also, an advantage of the embodiment can be described as follows: The deterioration diagnosis system according to the embodiment includes a first current sensor to be attached individually to at least lead wires of (N-1)-phases, and a second current sensor to be attached collectively to lead wires of all phases in a rotational machine. In addition, the system is able to detect a current amplitude in a frequency band ranging at least from 10 Hz to 10 MHz. As a result, a deterioration diagnosis such as a diagnosis of bearing deterioration or insulation deterioration is achieved, with a simple configuration.

As shown in FIG. 2, a frequency band in which a current amplitude appears varies depending on a cause of deterioration. Therefore, the deterioration diagnosis system according to the embodiment uses a current sensor which is capable of detecting a current amplitude arising from a plurality of deterioration causes for both of the first and second current sensors, or in other words, a current sensor which is capable of detecting a current amplitude in a frequency band ranging at least from 10 Hz to 10 MHz. Accordingly, in the embodiment, a deterioration diagnosis based on a plurality of events is achieved, with a reduced number of sensors.

Second Embodiment

Figure 3:
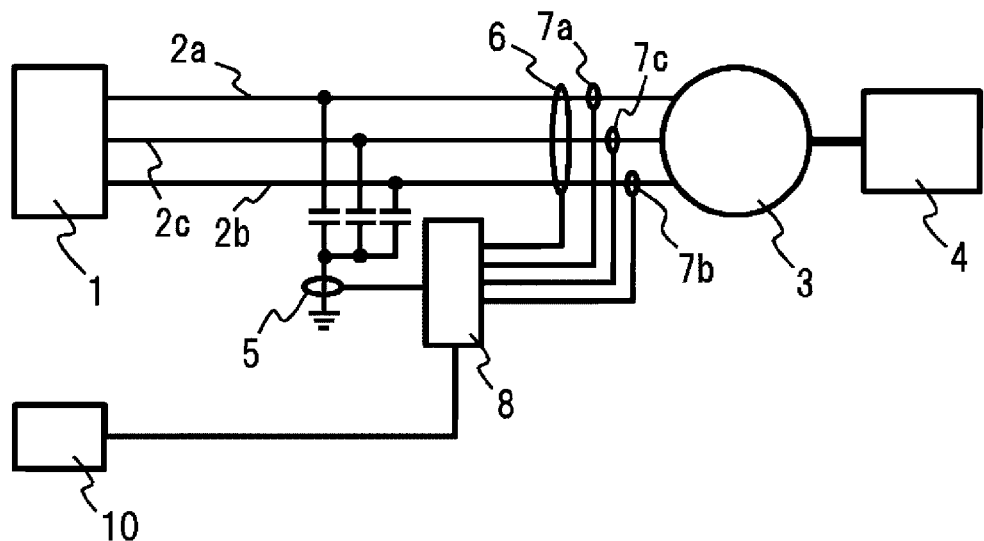
FIG. 3 is a configuration diagram of a deterioration diagnosis system according to a second embodiment of the present invention.

FIG. 3 is a configuration diagram showing a second embodiment of a bearing-deterioration and insulation-deterioration diagnosis system of the present invention. The second embodiment differs from the first embodiment in that a first current sensor 7a, 7b, 7c is attached individually to each feeder of all phases. With this configuration, a current value of each of all phases is obtained without needing to calculate the difference between the sum of values measured by the first current sensors and a value measured by the second current sensor 6. This improves the reliability of current measurement. In other respects, the second embodiment is basically the same as the first embodiment.

Third Embodiment

Figure 4:
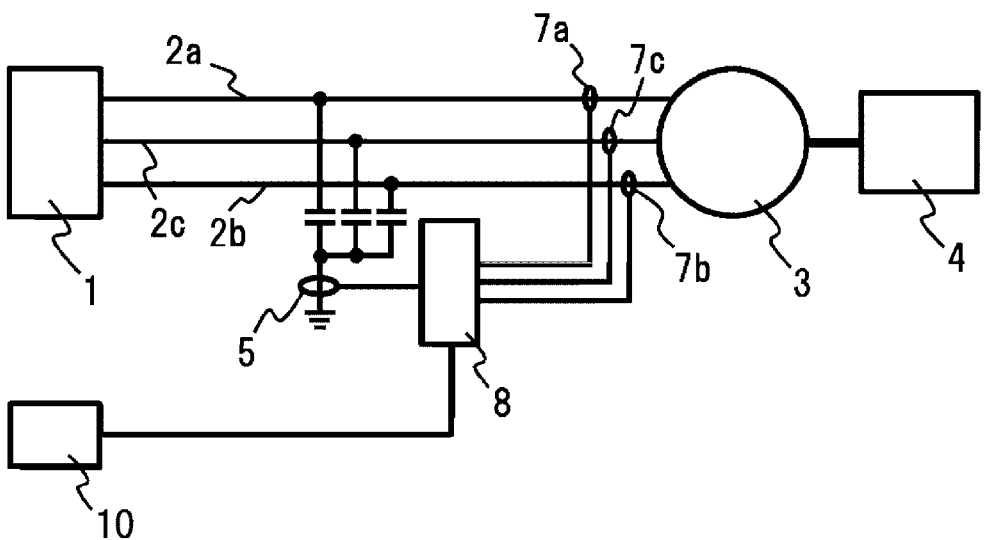
FIG. 4 is a configuration diagram of a deterioration diagnosis system according to a third embodiment of the present invention.

FIG. 4 is a configuration diagram showing a third embodiment of a bearing-deterioration and insulation-deterioration diagnosis system of the present invention. The third embodiment differs from the second embodiment in that a second current sensor 6 has been eliminated. In this case, a first current sensor 7a, 7b, 7c instead of the second current sensor 6 performs a measurement of a zero-phase current, whereas, in the first embodiment, the second current sensor 6 performs the function of measuring the zero-phase current. As a zero-phase current is smaller than a load current, the first current sensor 7a, 7b, 7c requires a wide-enough dynamic range. However, this configuration achieves a downsized sensor system. In other respects, the third embodiment is basically the same as the second embodiment.

Fourth Embodiment

Figure 5:
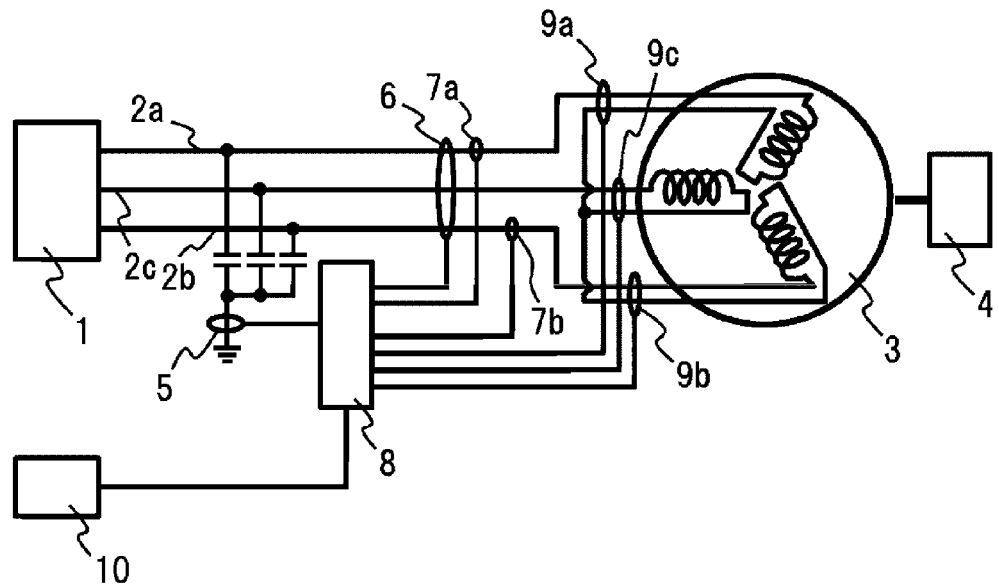
FIG. 5 is a configuration diagram of a deterioration diagnosis system according to a fourth embodiment of the present invention.

FIG. 5 is a configuration diagram showing a fourth embodiment of a bearing-deterioration and insulation-deterioration diagnosis system of the present invention. The fourth embodiment differs from the first embodiment in the following way: Both ends of a stator winding of each phase of a motor 3 are drawn out of the motor 3, such that two wires are drawn out of the motor 3 with respect to each phase. A fourth current sensor 9a, 9b, 9c is attached to the two wires drawn out of the motor 3 so as to surround the two wires, with respect to the stator winding of each phase. The fourth current sensor 9a, 9b, 9c is able to measure more directly a leakage current which flows through an insulating material of the stator winding of the each phase. Therefore, the fourth current sensor 9a, 9b, 9c is, when used in combination with a second current sensor 6, able to detect a sign of insulation deterioration more reliably. In other respects, the fourth embodiment is generally the same as the first embodiment.

Fifth Embodiment

Figure 6:
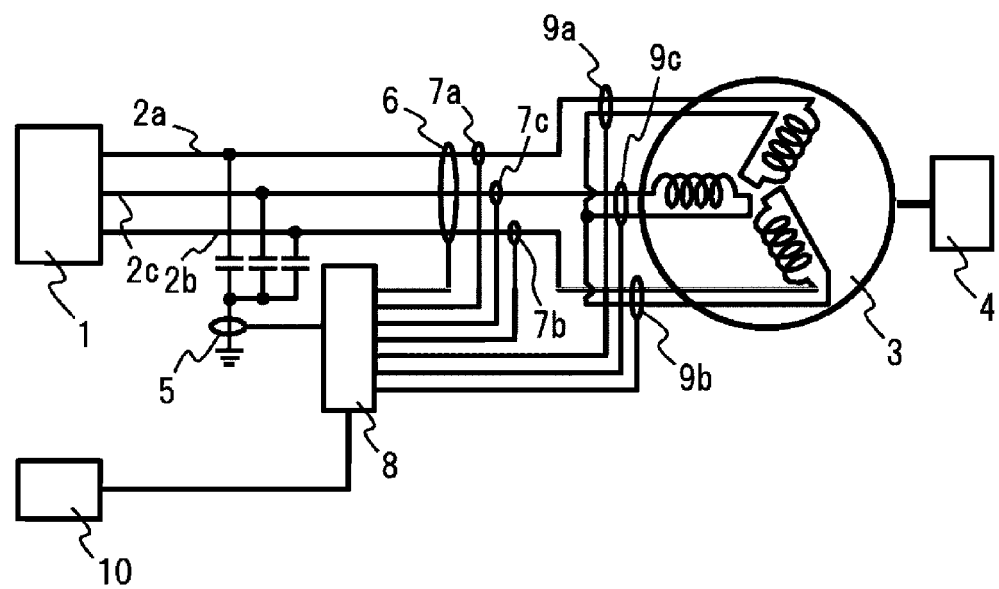
FIG. 6 is a configuration diagram of a deterioration diagnosis system according to a fifth embodiment of the present invention.

FIG. 6 is a configuration diagram showing a fifth embodiment of a bearing-deterioration and insulation-deterioration diagnosis system of the present invention. The fifth embodiment differs from the fourth embodiment in that a first current sensor 7a, 7b, 7c is attached individually to each feeder of all phases. With this configuration, a current value of each of all the phases is obtained without needing to calculate the difference between a value measured by a second current sensor 6 and the sum of values measured by the first current sensors. This further improves the reliability of current measurement. In other respects, the fifth embodiment is basically the same as the fourth embodiment.

Sixth Embodiment

Figure 7:
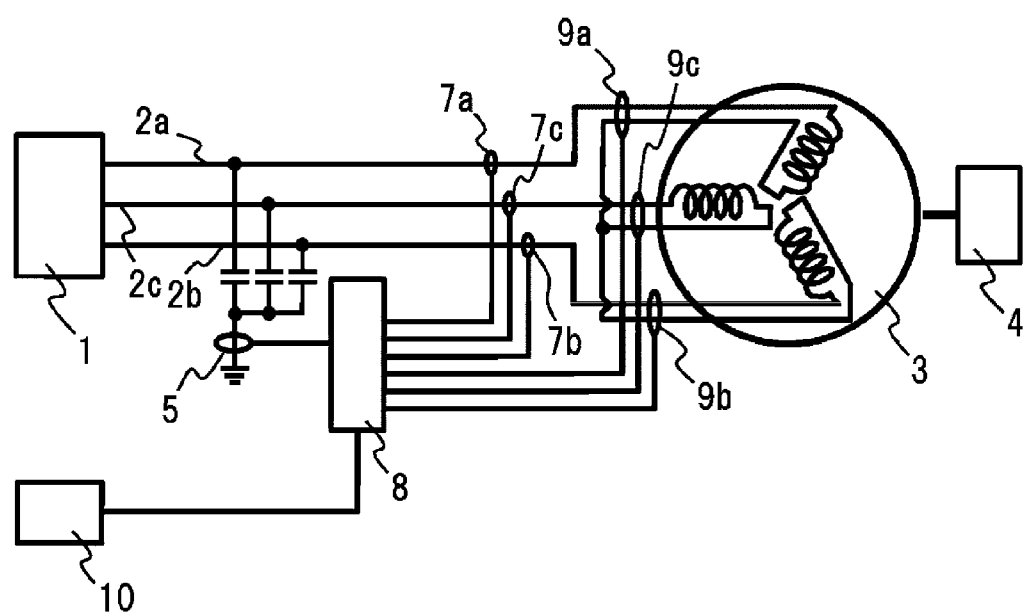
FIG. 7 is a configuration diagram of a deterioration diagnosis system according to a sixth embodiment of the present invention.

FIG. 7 is a configuration diagram showing a sixth embodiment of a bearing-deterioration and insulation-deterioration diagnosis system of the present invention. The sixth embodiment differs from the fifth embodiment in that a second current sensor 6 is eliminated. Theoretically, the sum of values measured by the fourth current sensor is approximately equal to a value measured by the second current sensor. Thus, unlike the third embodiment, the fourth current sensor functions in place of the second current sensor. Accordingly, the sixth embodiment is advantageous, since requirements for the dynamic range of the first current sensor are not very demanding. In other respects, the sixth embodiment is basically the same as the fifth embodiment.

What is claimed is:

1. A deterioration diagnosis system configured to diagnose deterioration of an N-phase rotational machine (N denotes a natural number), comprising:
    a first current sensor to be attached individually to at least lead wires of (N-1)-phases in the rotational machine, so as to detect a current amplitude arising from a plurality of deterioration causes;
    a second current sensor to be attached collectively to the lead wires of all phases in the rotational machine, so as to detect a current amplitude arising from a plurality of deterioration causes; and
    a third current sensor attached collectively to ground wires connected individually to the lead wires of each of the phases, wherein
    the first current sensor and the second current sensor detect a current amplitude in a frequency band ranging from 0 Hz to 100 MHz, and
    the third current sensor detects a current amplitude in a frequency band from 1 MHz and over.

2. The deterioration diagnosis system according to claim 1, wherein
    the second current sensor is not provided, and instead the first current sensor is attached individually to the lead wires of all the phases.

3. The deterioration diagnosis system according to claim 1, wherein both ends of a stator winding are drawn out of the rotational machine, such that the lead wire of each phase is formed of two wires drawn out of the rotational machine, and the deterioration diagnosis system further comprises a fourth current sensor to be attached to the two wires drawn out of the rotational machine so as to surround the two wires, with respect to the stator winding of each phase.

4. The deterioration diagnosis system according to claim 1, further comprising an analyzer configured to analyze a detection signal from at least one of the current sensors.

5. The deterioration diagnosis system according to claim 4, wherein the analyzer performs frequency separation of the detection signal and performs different processing with respect to each frequency band.

6. The deterioration diagnosis system of claim 4, further comprising an information transmission unit configured to convey, to a user, a piece of information relating to a sign of bearing deterioration and a piece of information relating to a sign of insulation deterioration, which have been obtained through processing performed in the analyzer.

7. The deterioration diagnosis system according to claim 6, wherein the piece of information relating to a sign of bearing deterioration and the piece of information relating to a sign of insulation deterioration are combined, so that a predictive diagnosis is made based on a combination of the pieces of information.

8. A deterioration diagnosis system configured to diagnose deterioration of an N-phase rotational machine (N denotes a natural number), comprising:
a first current sensor to be attached individually to at least lead wires of (N-1)-phases in the rotational machine, the first current sensor being configured to detect a current amplitude in a frequency band ranging at least from 10 Hz to 10 MHz;
a second current sensor to be attached collectively to the lead wires of all phases in the rotational machine, the second current sensor being configured to detect a current amplitude in a frequency band ranging at least from 10 Hz to 10 MHz; and
a third current sensor attached collectively to ground wires connected individually to the lead wires of each of the phases,
wherein the third current sensor detects a current amplitude in a frequency band from 1 MHz and over.

9. The deterioration diagnosis system according to claim 8, wherein
the second current sensor is not provided, and instead the first current sensor is attached individually to the lead wires of all of the phases.

10. The deterioration diagnosis system according to claim 8, wherein the first current sensor and the second current sensor detect a current amplitude in a frequency band ranging from 0 Hz to 100 MHz.

11. The deterioration diagnosis system according to claim 8, wherein both ends of a stator winding are drawn out of the rotational machine, such that the lead wire of each phase is formed of two wires drawn out of the rotational machine, and the deterioration diagnosis system further comprises
a fourth current sensor to be attached to the two wires drawn out of the rotational machine so as to surround the two wires, with respect to the stator winding of each phase.

12. The deterioration diagnosis system according to claim 8, further comprising an analyzer configured to analyze a detection signal from at least one of the current sensors.

13. The deterioration diagnosis system according to claim 12, wherein the analyzer performs frequency separation of the detection signal and performs different processing with respect to each frequency band.

14. The deterioration diagnosis system according to claim 12, further comprising an information transmission unit configured to convey, to a user, a piece of information relating to a sign of bearing deterioration and a piece of information relating to a sign of insulation deterioration, which have been obtained through processing performed in the analyzer.

15. The deterioration diagnosis system according to claim 14, wherein the piece of information relating to a sign of bearing deterioration and the piece of information relating to a sign of insulation deterioration are combined, so that a predictive diagnosis is made based on a combination of the pieces of information.

16. A deterioration diagnosis system configured to diagnose deterioration of an N-phase rotational machine (N denotes a natural number), comprising:
a first current sensor to be attached individually to at least lead wires of (N-1)-phases in the rotational machine, so as to detect a current amplitude arising from a plurality of deterioration causes;
a second current sensor to be attached collectively to the lead wires of all phases in the rotational machine, so as to detect a current amplitude arising from a plurality of deterioration causes; and
a third current sensor attached collectively to ground wires connected individually to the lead wires of each of the phases, wherein
both ends of a stator winding are drawn out of the rotational machine, such that the lead wire of each phase is formed of two wires drawn out of the rotational machine, and the deterioration diagnosis system further comprises
a fourth current sensor to be attached to the two wires drawn out of the rotational machine so as to surround the two wires, with respect to the stator winding of each phase.

17. A deterioration diagnosis system configured to diagnose deterioration of an N-phase rotational machine (N denotes a natural number), comprising:
a first current sensor to be attached individually to at least lead wires of (N-1)-phases in the rotational machine, the first current sensor being configured to detect a current amplitude in a frequency band ranging at least from 10 Hz to 10 MHz;
a second current sensor to be attached collectively to the lead wires of all phases in the rotational machine, the second current sensor being configured to detect a current amplitude in a frequency band ranging at least from 10 Hz to 10 MHz; and
a third current sensor attached collectively to ground wires connected individually to the lead wires of each of the phases, wherein
both ends of a stator winding are drawn out of the rotational machine, such that the lead wire of each phase is formed of two wires drawn out of the rotational machine, and the deterioration diagnosis system further comprises
a fourth current sensor to be attached to the two wires drawn out of the rotational machine so as to surround the two wires, with respect to the stator winding of each phase.

* * * * *